(12) United States Patent
Holovinger et al.

(10) Patent No.: US 10,095,121 B2
(45) Date of Patent: Oct. 9, 2018

(54) OPTIMIZING THE UTILIZATION OF METROLOGY TOOLS

(71) Applicant: KLA-Tencor Corporation, Milpitas, CA (US)

(72) Inventors: Tsachy Holovinger, Modiin (IL); Liran Yerushalmi, Yaacob (IL); David Tien, Santa Clara, CA (US); DongSub Choi, Yongin (KR)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/002,129

(22) Filed: Jan. 20, 2016

(65) Prior Publication Data

US 2016/0131983 A1    May 12, 2016

Related U.S. Application Data

(63) Continuation of application No. PCT/US2015/048426, filed on Sep. 3, 2015.

(60) Provisional application No. 62/045,537, filed on Sep. 3, 2014.

(51) Int. Cl.
*G01B 11/00* (2006.01)
*G03F 7/20* (2006.01)
*H01L 21/66* (2006.01)
*G03F 9/00* (2006.01)

(52) U.S. Cl.
CPC ........ *G03F 7/70633* (2013.01); *G03F 9/7003* (2013.01); *H01L 22/12* (2013.01); *H01L 22/20* (2013.01)

(58) Field of Classification Search
CPC ............ G03F 9/00; H01L 22/00; G01B 11/00
USPC .................................................. 356/399–401
See application file for complete search history.

(56) References Cited

U.S. PATENT DOCUMENTS

| | | |
|---|---|---|
| 5,403,754 A | 4/1995 | Jackson |
| 6,486,492 B1 | 11/2002 | Su |
| 6,625,497 B2 | 9/2003 | Fairbairn et al. |
| 6,654,695 B2 | 11/2003 | Nulman |
| 6,654,698 B2 | 11/2003 | Nulman |
| 6,978,189 B1 | 12/2005 | Bode et al. |
| 7,018,855 B2 | 3/2006 | Kota et al. |
| 7,065,737 B2 | 6/2006 | Phan et al. |
| 7,236,847 B2 | 6/2007 | Marella |
| 7,254,458 B2 | 8/2007 | Hasan |
| 7,403,832 B2 | 7/2008 | Schulze et al. |

(Continued)

FOREIGN PATENT DOCUMENTS

WO    2006/031263    3/2006

*Primary Examiner* — Tarifur Chowdhury
*Assistant Examiner* — Isiaka Akanbi
(74) *Attorney, Agent, or Firm* — Suiter Swantz pc llo

(57) ABSTRACT

Methods and corresponding metrology modules and systems, which measure metrology parameter(s) of a previous layer of a metrology target and/or an alignment mark, prior to producing a current layer of the metrology target, derive merit figure(s) from the measured metrology parameter(s) to indicate an inaccuracy, and compensate for the inaccuracy to enhance subsequent overlay measurements of the metrology target. In an example embodiment, methods and corresponding metrology modules and systems use stand-alone metrology tool(s) and track-integrated metrology tool(s) at distinct measurement patterns to address separately different aspects of variation among wafers.

19 Claims, 7 Drawing Sheets

(56) References Cited

U.S. PATENT DOCUMENTS

| | | | |
|---|---|---|---|
| 7,589,845 B1 | 9/2009 | Tian et al. | |
| 7,595,869 B1 | 9/2009 | Tian et al. | |
| 7,742,889 B2 | 6/2010 | Tian et al. | |
| 7,761,178 B2 | 7/2010 | Tian et al. | |
| 7,876,438 B2* | 1/2011 | Ghinovker | G03F 7/70633 257/48 |
| 8,111,376 B2 | 2/2012 | Adel et al. | |
| 8,175,831 B2 | 5/2012 | Izikson et al. | |
| 8,638,438 B2 | 1/2014 | Ausschnitt et al. | |
| 2003/0015674 A1 | 1/2003 | Broermann | |
| 2005/0069791 A1 | 3/2005 | Yamamoto | |
| 2008/0094630 A1* | 4/2008 | Mieher | G01N 21/956 356/401 |
| 2009/0303482 A1* | 12/2009 | Levinski | H01L 21/67294 356/400 |
| 2013/0035888 A1* | 2/2013 | Kandel | G03F 7/70633 702/81 |
| 2014/0060148 A1* | 3/2014 | Amit | G01B 21/042 73/1.79 |
| 2014/0111791 A1* | 4/2014 | Manassen | G01B 9/02027 356/51 |
| 2014/0375984 A1* | 12/2014 | Choi | G01N 21/93 356/73 |
| 2015/0154746 A1 | 6/2015 | Zafar et al. | |
| 2015/0292877 A1* | 10/2015 | Marciano | G06F 17/5081 356/401 |

* cited by examiner

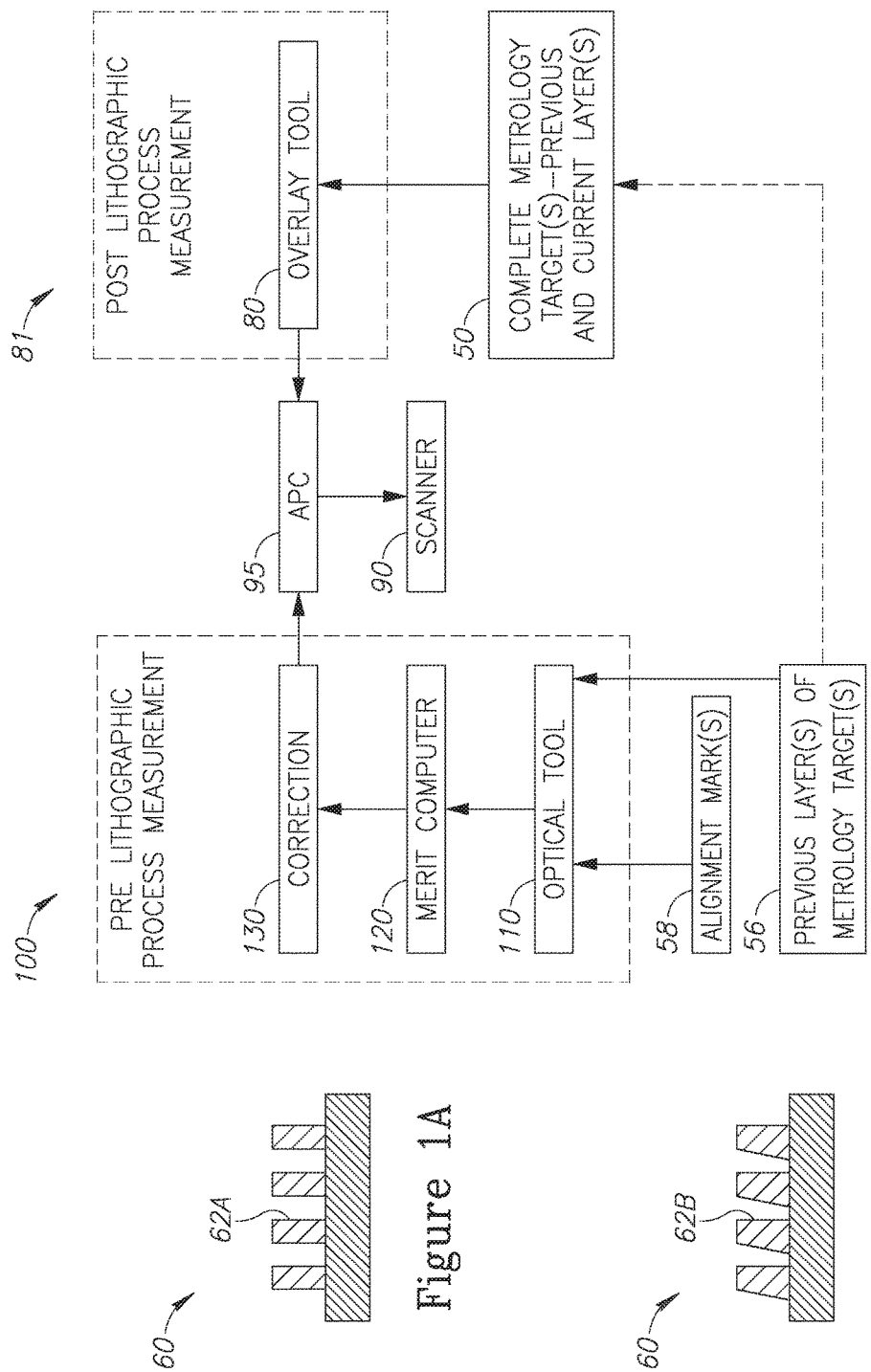

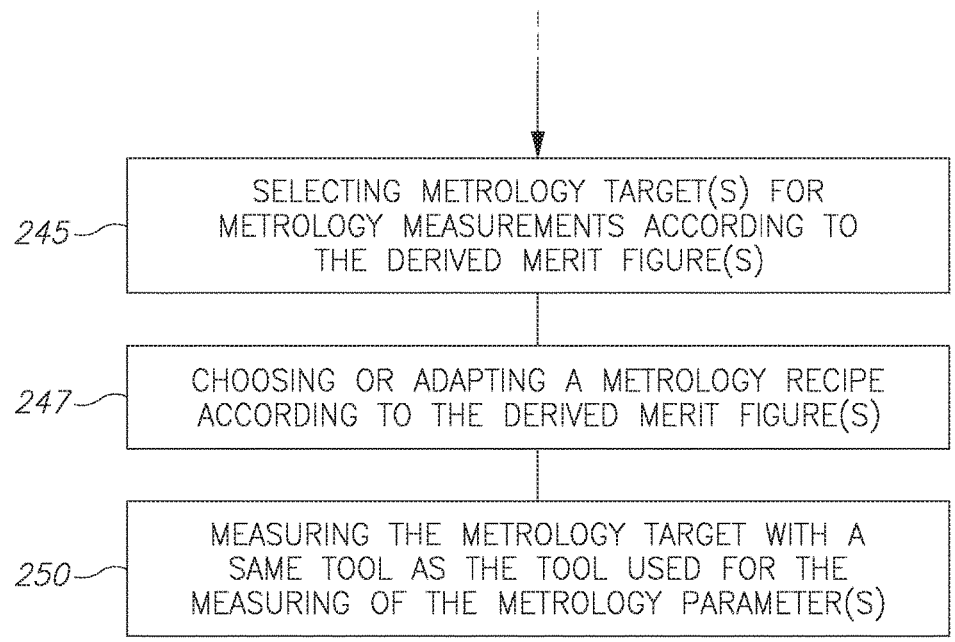
Figure 4 (cont. 1)

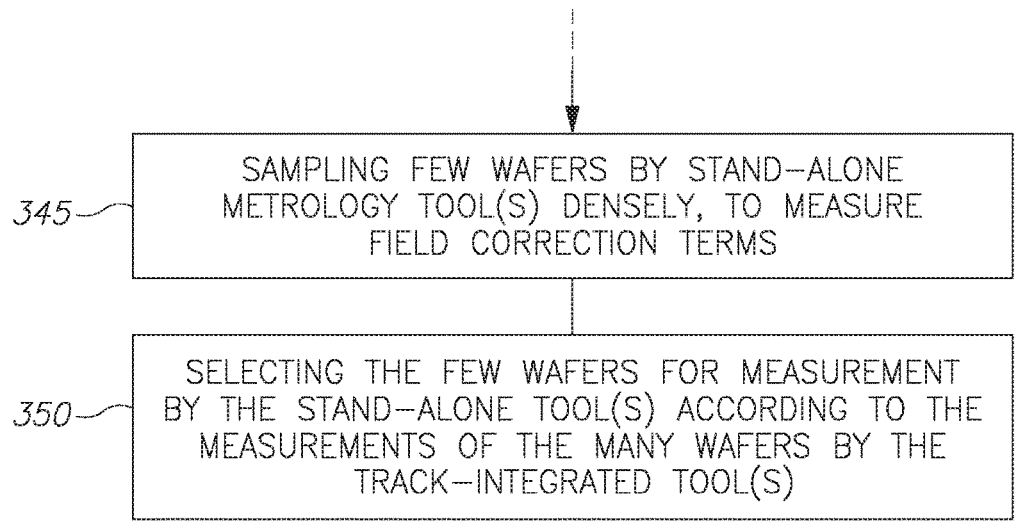
Figure 6 (cont. 1)

OPTIMIZING THE UTILIZATION OF METROLOGY TOOLS

CROSS REFERENCE TO RELATED APPLICATIONS

This application is filed under 35 U.S.C. § 111(a) and § 365(c) as a continuation of International Patent Application No. PCT/US2015/048426, filed Sep. 3, 2015, which application claims the benefit of U.S. Provisional Patent Application No. 62/045,537 filed on Sep. 3, 2014, which applications are incorporated herein by reference in their entirety.

TECHNICAL FIELD

The present disclosure relates to the field of metrology, and more particularly, to utilizing metrology tools in more efficient ways.

BACKGROUND

Current lithography process control evaluates critical dimensions (CDs), overlay, side wall angles (SWA), focus and dose etc. and is carried out after the lithography process is completed, i.e., after the process on the track, the application of the lithography tool (e.g., scanner, stepper) and additional and track processes (e.g., develop) have taken place. The associated metrology processes are used to detect need for rework and scanner correction terms, e.g., in a feedback mode. Current process control is carried out by stand-alone tools or by track-integrated tools, which are operated in similar manners.

Advanced nodes technology has very limited overlay budgets that dictate narrow process windows of 4 nm and below. Currently the overlay (OVL) is measured after the process in the lithography cell, and the data is used for calculating rework disposition and scanner correction terms. The alignment of the current exposure to previous exposure is being done using alignment marks that are printed on the wafer in a previous exposure. The overlay is measured on a different target, that includes at least two features, one is printed in the previous layer and one in the current.

Before and during the wafer exposure the scanner is looking for the alignment marks and calculates their location, by doing that the scanner aligns the previous layer pattern with new layer pattern it is about to be printed. The method of measurement and the algorithm that is being used to calculate the location of the target might be sensitive to process induced errors. Stated differently, the asymmetry of the features profile in the alignment mark might create a systematic error in the alignment of the wafer. If this process-induced asymmetry is changing along the wafer, it may induce a within-wafer (and even within-field) overlay variation. Currently those errors are being detected by carrying out overlay measurements after the development process in the lithography cell. If the wafers fail specific criteria, they go through a rework process in which the resist and other layers on the wafer (e.g., BARC—the bottom anti-reflective coating layer) are stripped and cleaned and the wafers are returned for subsequent lithographic processing. The rework process is time consuming, reduces the die yield, and may have other costs.

SUMMARY

The following is a simplified summary providing an initial understanding of the invention. The summary does not necessarily identify key elements nor limits the scope of the invention, but merely serves as an introduction to the following description.

One aspect of the present invention provides a method comprising measuring at least one metrology parameter of at least one of a previous layer of a metrology target and an alignment mark, prior to producing a current layer of the metrology target, deriving at least one merit figure from the at least one measured metrology parameter to indicate an inaccuracy, and compensating for the inaccuracy to enhance subsequent overlay measurements of the metrology target.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings:

FIGS. 1A and 1B are high level schematic cross section view illustrations of lines that construct alignment marks without and with process-induced alignment target asymmetry, respectively, according to some embodiments of the invention.

FIG. 2 is a high level flowchart illustrating the use of pre-lithographic-process measurements, according to some embodiments of the invention.

DETAILED DESCRIPTION

Figure 3:
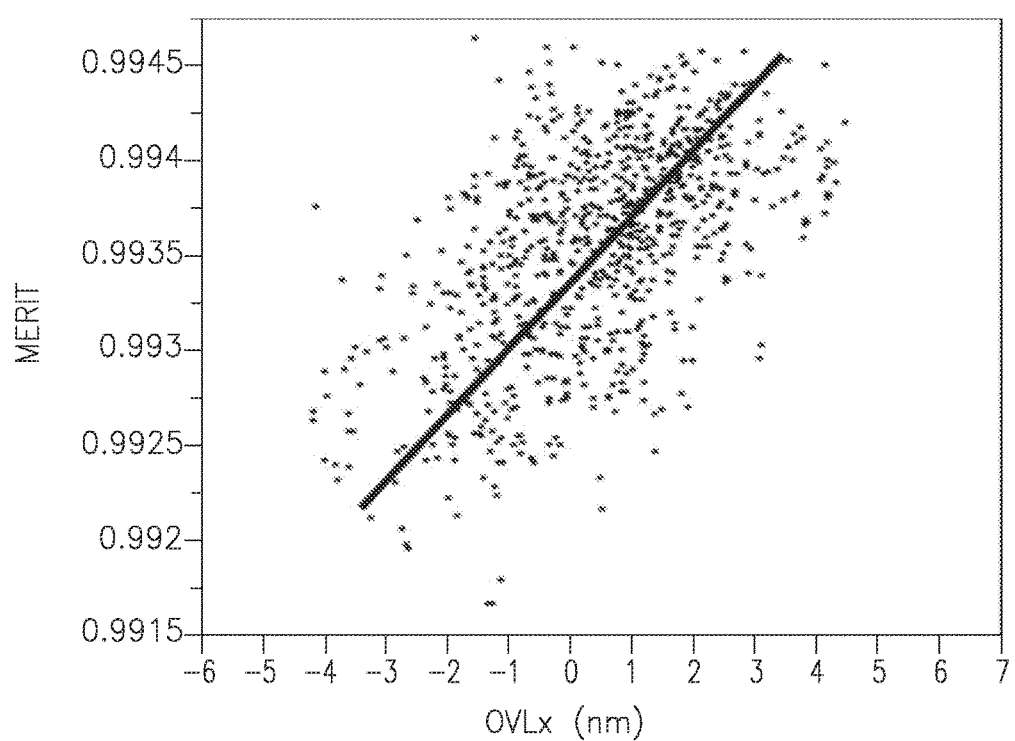
FIG. 3 is an exemplary illustration of a correlation between the overlay and one of the suggested merit figures, according to some embodiments of the invention.

With specific reference now to the drawings in detail, it is stressed that the particulars shown are by way of example and for purposes of illustrative discussion of embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways. Also, it is to be understood that the phraseology and terminology employed herein is for the purpose of description and should not be regarded as limiting.

Methods and corresponding metrology modules and systems are provided, which measure metrology parameter(s) of a previous layer of a metrology target and/or an alignment mark, prior to producing a current layer of the metrology target, derive merit figure(s) from the measured metrology parameter(s) to indicate an inaccuracy, and compensate for the inaccuracy to enhance subsequent overlay measurements of the metrology target.

Certain embodiments provide measurements, e.g., by stand-alone, track-integrated, etch-integrated or any other in-situ optical metrology tool, of optical and/or structural characteristics, such as critical dimensions (e.g., height, side wall angle, pitch, line width), film thickness, refractive indices and overlay before and after the track process, of device or test features during semiconductor manufacture. The measurements may be carried out after resist strip process (AEI—After Etch Inspection). For lithography multiple patterning, the measurements may be carried out between exposures within a single layer.

For example, the wafers may be measured by an optical tool before processing in the lithography cell. In the measurement, the alignment marks may be measured in addition to part of the overlay target, both generally printed during a previous lithographic step and prior to subsequent processing (e.g., polishing, etching etc.). The measured data may be used to generate merit figure(s) that correlate with systematic errors in the consecutive overlay measurement (after production of the current layer of the targets by lithographic exposure). The overlay error that is measured after the lithographic process may be due to e.g., alignment measurement error due to optical bias associated with process induced alignment target asymmetry and/or random or systematic contributions related to the mechanics and control loops of the wafers and reticle stages.

An example for process induced alignment target asymmetry is illustrated in FIGS. 1A and 1B, schematically illustrating cross section views of lines that construct alignment marks, without and with process-induced alignment target asymmetry, respectively, according to some embodiments of the invention. The alignment target on a wafer 60 should have no side wall angle, as illustrated in elements 62A of FIG. 1A, while one form of process-induced alignment target asymmetry may result in a side wall angle (SWA) on one side or both sides of the alignment target elements, the former case illustrated in elements 62B of FIG. 1B. This error in turn may induce systematic error in the scanner alignment system (e.g., contribute to the wafer stage location error in the scanner). It is noted the previous layer(s) of metrology target(s) may be used to derive similar process-induced asymmetry measures as the alignment target(s) and FIG. 1A, 1B may be understood as representing an example of target element asymmetry in a previous layer of a metrology target as well.

One or more merit figure(s) may be calculated based on an image (e.g., in the field plane, in the pupil plane, or any combination thereof) of the alignment mark or of a previous layer in an overlay mark. The merit figure(s) may comprise mathematical manipulation(s) on the image of one of these features and/or combine measurement data from multiple alignment marks and/or metrology target(s) previous layer structures. The merit figure(s), when correlated with the post lithographic process measured overlay error, may be used to correct alignment systematic errors, e.g., by automatic process control (APC) of the lithography cell.

FIG. 2 is a high level flowchart illustrating the use of pre-lithographic-process measurements 100, according to some embodiments of the invention. While post-lithographic measurements 81 are carried out after the lithographic process, e.g., by an overlay tool 80 after production of the respective metrology targets 50, certain embodiments comprise measurements 100 which are carried out prior to the completion of the metrology targets and/or on alignment mark(s) 58 and are thus pre-lithographic-process measurements. Alignment mark(s) 58 and or previous layer(s) of metrology target(s) 56 (prior to complete production of the metrology targets, e.g., prior to production of the current layer) may be measured by an optical tool 110, and corresponding merit figures may be calculated by a merit computer 120 (which may be part of a metrology tool). Correction factors 130 may be derived from the merit figures and used by APC 95 to correct the production process e.g., of the current layer of devices and/or metrology targets by a scanner 90 or any other lithographic tool. The disclosed method may be regarded as a feed forward to APC 95 which improves the scanner alignment performance and reduce the rework rate. Alternatively or complementarily, when based on measurements of previous layer(s) of metrology target(s) 56, the derived merit figure(s) may be used to select metrology target(s) for metrology measurements and/or to choose or adapt (i.e., select parameters of) a metrology recipe, based e.g., on relations between target asymmetry and accuracy of recipe parameters.

FIG. 3 is an exemplary illustration of a correlation between the overlay and one of the suggested merit figures, according to some embodiments of the invention. The illustrated merit represents inaccuracy and is unit-less. The merit is calculated on the basis of previous layer measurements while the overlay is measured after the full production of the metrology target. It is noted that various merits may be used, such as merits comprising various mathematical manipulations on the image of any of the marks or targets and/or various measurement data from multiple alignment marks and/or metrology target(s) previous layer structures. Image manipulation data and measurement data may be combined to for merit(s). It is noted that the correlation is due to similar effects on the layers by the production tool (e.g., scanner 90), which are manifested in measurements 100 and 81, such as optical aberrations of scanner 90. The data is shown for the x direction, and the correlation indicates the possibility to apply correction factor(s) 130 even before the production of the metrology target is completed. For example, the slope or other parameters of the correlation may be used to calculate correction factor(s) 130, possibly further dependent on the location on the wafer of the specific measurement, which may then be used to correct current production of the same wafer and/or of wafers in the same lot (typically a group of 25 wafers) by APC 95. Clearly, correlations between the merit figure(s) and the metrology results (such as overlay) may be found to be more complex and correction factor(s) 130 may be calculated accordingly. It is noted that different layers may be used as previous layer, depending on the advance of the lithographic process and the specific metrology targets and alignment marks which are used. It is further noted that the derivation of the empirical correlations between measurements 81, 100 may be carried out by using the same measurement tool for the pre- and post-lithographic process metrology 100, 81 (respectively) to avoid tool-related errors. The measurement tool may be integrated or stand-alone.

In some cases the same phenomena in the pre lithographic process can create the same merit that triggers the correction terms feed forward. In such cases the post lithographic process overlay measurement are larger and the lot is being reworked without the contribution of the feed forward method. In certain embodiments, when the feed forward correction parameters are too high (above a given threshold), the algorithm may disregard them and not use the feedforward data in order to prevent too high corrections.

In certain embodiments, measurements 100 and/or the merit figure(s) may be used to select wafer locations, alignment marks and/or metrology targets which have expected small errors and remove wafer locations, alignment marks and/or metrology targets having large expected errors from use by APC 95. For example, marks or targets expected to have large side wall angles may be removed from consideration and use.

Figure 4:
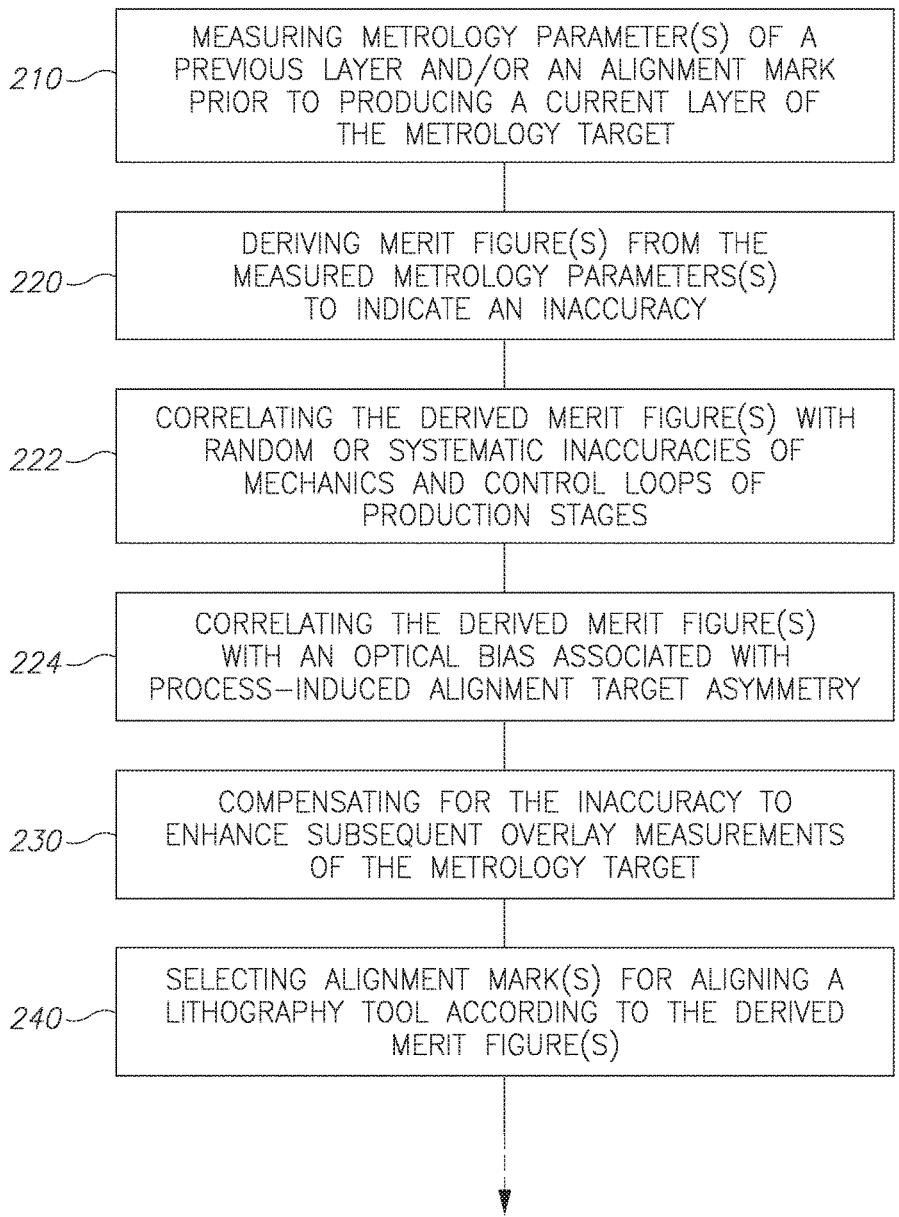
FIG. 4 is a high level flowchart illustrating a method, according to some embodiments of the invention.

FIG. 4 is a high level flowchart illustrating a method 200, according to some embodiments of the invention. Method 200 may be at least partially implemented by at least one computer processor, e.g., in a metrology module. Certain embodiments comprise computer program products comprising a computer readable storage medium having computer readable program embodied therewith and configured to carry out of the relevant stages of method 200. Certain embodiments comprise metrology measurements resulting from method 200.

Method 200 may comprise measuring at least one metrology parameter of at least one of a previous layer of a metrology target and an alignment mark, prior to producing a current layer of the metrology target (stage 210), deriving at least one merit figure from the at least one measured metrology parameter to indicate an inaccuracy (stage 220), and compensating for the inaccuracy to enhance subsequent overlay measurements of the metrology target (stage 230). Measuring the metrology target may be carried out with a same tool as the tool used for the measuring of the at least one metrology parameter (stage 250).

Method 200 may further comprise correlating the derived at least one merit figure with random or systematic inaccuracies of mechanics and control loops of production stages (stage 222).

In certain embodiments, the at least one metrology parameter may be measured on the alignment mark and method 200 may further comprise correlating the derived merit figure with an optical bias associated with process-induced alignment target asymmetry (stage 224) and optionally selecting at least one alignment mark for aligning a lithography tool according to the derived merit figure (stage 240).

In certain embodiments, the at least one metrology parameter may be measured on the previous layer and method 200 may further comprise selecting at least one metrology target for metrology measurements according to the derived merit figure (stage 245) and/or choosing or adapting a metrology recipe according to the derived merit figure (stage 247). Certain embodiments comprise combinations of stages 224 and 240.

Methods and corresponding metrology modules and systems may further use stand-alone metrology tool(s) and track-integrated metrology tool(s) at distinct measurement patterns to address separately different aspects of variation among wafers.

Figure 5:
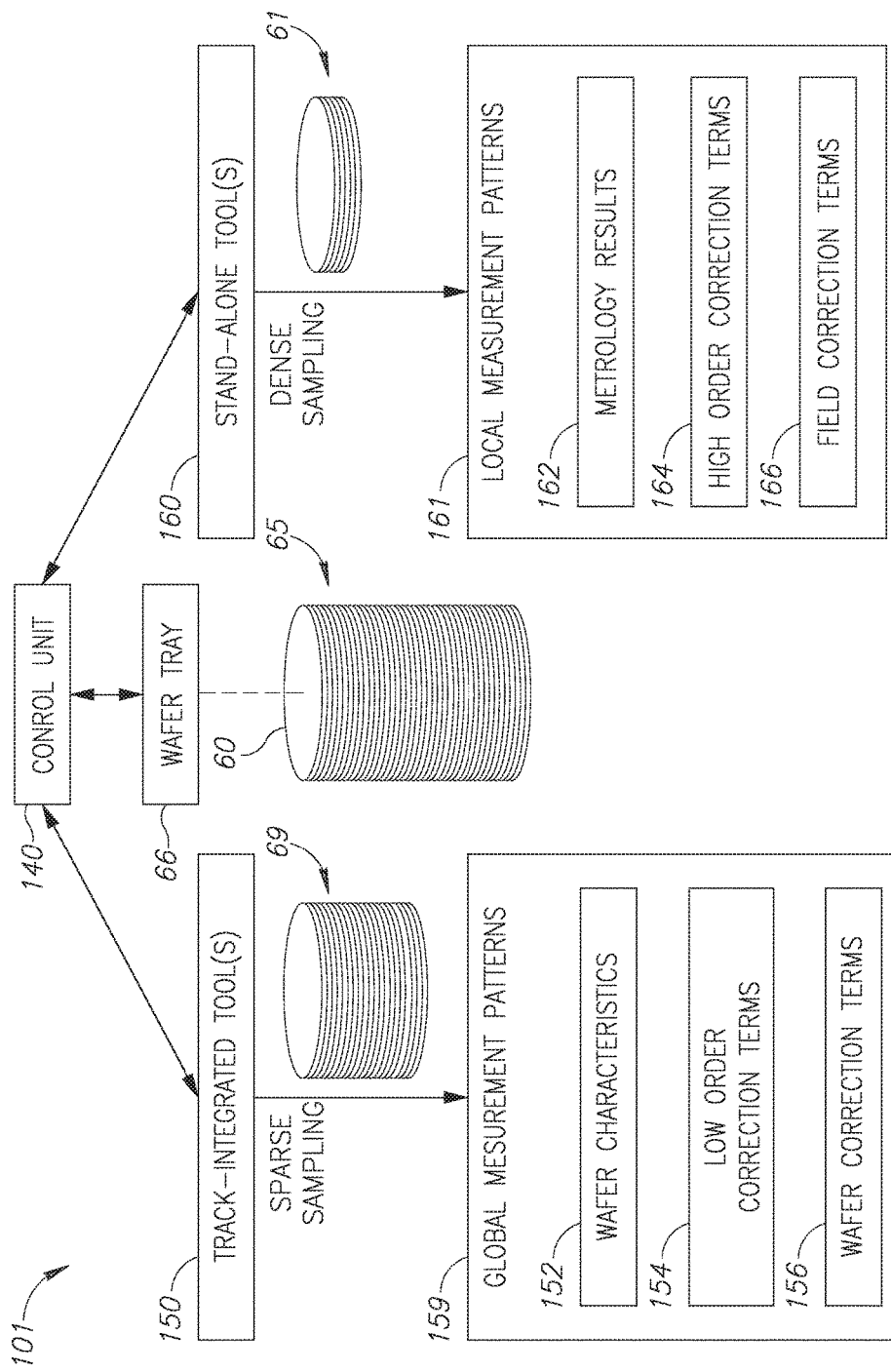
FIG. 5 is a high level schematic illustration of a metrology system, according to some embodiments of the invention.

FIG. 5 is a high level schematic illustration of a metrology system 101, according to some embodiments of the invention. Metrology system 101 may comprise at least one stand-alone metrology tool 160 and at least one track-integrated metrology tool 150, operated according to embodiments that are described below and/or according to a method 300 illustrated in FIG. 6 below, e.g., via a control unit 140 configured to manage distinct measurement patterns 159, 161 of tools 150, 160, respectively. Control unit 140 may be configured to control a wafer tray 66 to provide wafers 60 from a wafer lot 65 to tools 150, 160.

Currently, stand-alone tools and track-integrated tools are used interchangeably and in a similar way. Stand-alone tools and track-integrated tools operate according to similar principle, yet differ in that track-integrated tools, being integrated in the track of the lithography unit, are critically limited in the measurement time available to them. The available time for metrology measurements by track-integrated tools is limited to a specified time derived from lithography unit flow in order to avoid reduction in the throughput of the lithography unit (scanner and track) due to longer measurement time. In certain embodiments, track-integrated tools 150 and stand-alone tools 160 may be used in combination to improve the process control. In advanced nodes, the wafer-to-wafer variation becomes a major contributor to the overlay error and presents the following challenges related to rework detection and correction terms validity to all wafers. In case the wafer-to-wafer variation is systematic, e.g., variation due to lens and mask heating, a compensation factor may be calculated and used to compensate for the variation. In case the variation is random and changes rapidly from lot to lot, a larger number of measurements is required to improve the detection of the variation and faster feedback is required for tool correction to compensate for the variation.

Certain embodiments comprise using track-integrated metrology tool(s) 150 and stand-alone metrology tool(s) 160 at different and distinct measurement patterns 159, 161 to address separately different aspects of variation among wafers. Measurement patterns 159, 161 may comprise sparse sampling of many wafers 69 per lot 65 by track-integrated tools 150 to yield global measurement patterns 159 and dense sampling of fewer wafers 61 per lot 65 by stand-alone tools 160 yield local measurement patterns 161. It is noted that the terms global and local are used here to relate to the characterization of wafers 60 in wafer lot 65, i.e., to lot-level variation, and to the characterization of fields in wafers 60, i.e., to wafer-level variation, respectively.

For example, sparse sampling on track-integrated metrology tools 150 may be aimed to yield measurements of wafer characteristics 152 that are used to detect rework need and to select the best wafer(s) to be measured in more detail, e.g., by stand-alone metrology tool(s) 160 to yield metrology results 162. As the number of wafers that can be measured as well as the density of measurements of each wafers are limited, the suggested embodiments provide an advantage over the current practice of measuring wafers 60 from specific locations in lot 65. Measuring selected wafers may improve the correction terms and represent better the typical wafers and the current lithography tool conditions rather than other problems which are not related to the lithography process step. Disclosed embodiments provide improved detection (e.g., for rework) of excessive variation as it is characterized by a faster response time due to the sparse sampling of more wafers 60 per lot 65. A non-limiting numerical example for sampling patterns may include, as global measurement pattern 159, 30-50 points per wafer on 15-25 wafers measured by track-integrated tool 150 and, as local measurement pattern 161, 600 points per wafer measured on 2 wafers by stand-alone tool 160.

In another example, sparse sampling on track-integrated metrology tools 150 may be aimed to yield a linear or a low order correction terms 154 to the lithography tool as a quick correction, while dense sampling on stand-alone tools 160 may be aimed to yield high order correction terms 164 as a more exact but slower correction. A non-limiting numerical example for sampling patterns may include, as global measurement pattern 159, 100-200 points per wafer on 5-10 wafers measured by track-integrated tool 150 and, as local measurement pattern 161, 600 points per wafer measured on 2 wafers by stand-alone tool 160. Due to the limited allowed time for integrated metrology tool, less dense sampling is being expected like in pattern 159, and the practically possible contribution for the control or correction model is likewise limited in track-integrated metrology.

In yet another example, sparse sampling on track-integrated metrology tools 150 may be aimed to yield wafer correction terms 156, while dense sampling on stand-alone tools 160 may be aimed to yield field correction terms 166. The wafer correction terms and field correction terms which are thus calculated may be used in different modules to correct the lithography tool. High order wafer and field correction terms may be achieved by sampling patterns that include, as global measurement pattern 159, 100-200 points per wafer on 5-10 wafers measured by track-integrated tool 150 and, as local measurement pattern 161, 600 points per wafer measured on 2 wafers by stand-alone tool 160. Advantageously, wafer and field correction terms are derived faster and more accurately than in current methods. Wafer for measurement by stand-alone tool 160 may be selected according to wafer measurements by track-integrated tool 150.

The producer may collect all the correction terms from the different sources and then calculate a statistical aggregation in order to have controlled process over time. The corresponding correction terms may be derived adaptively over time to compensate for errors related to the source of the corrections and to control unit 140.

Figure 6:
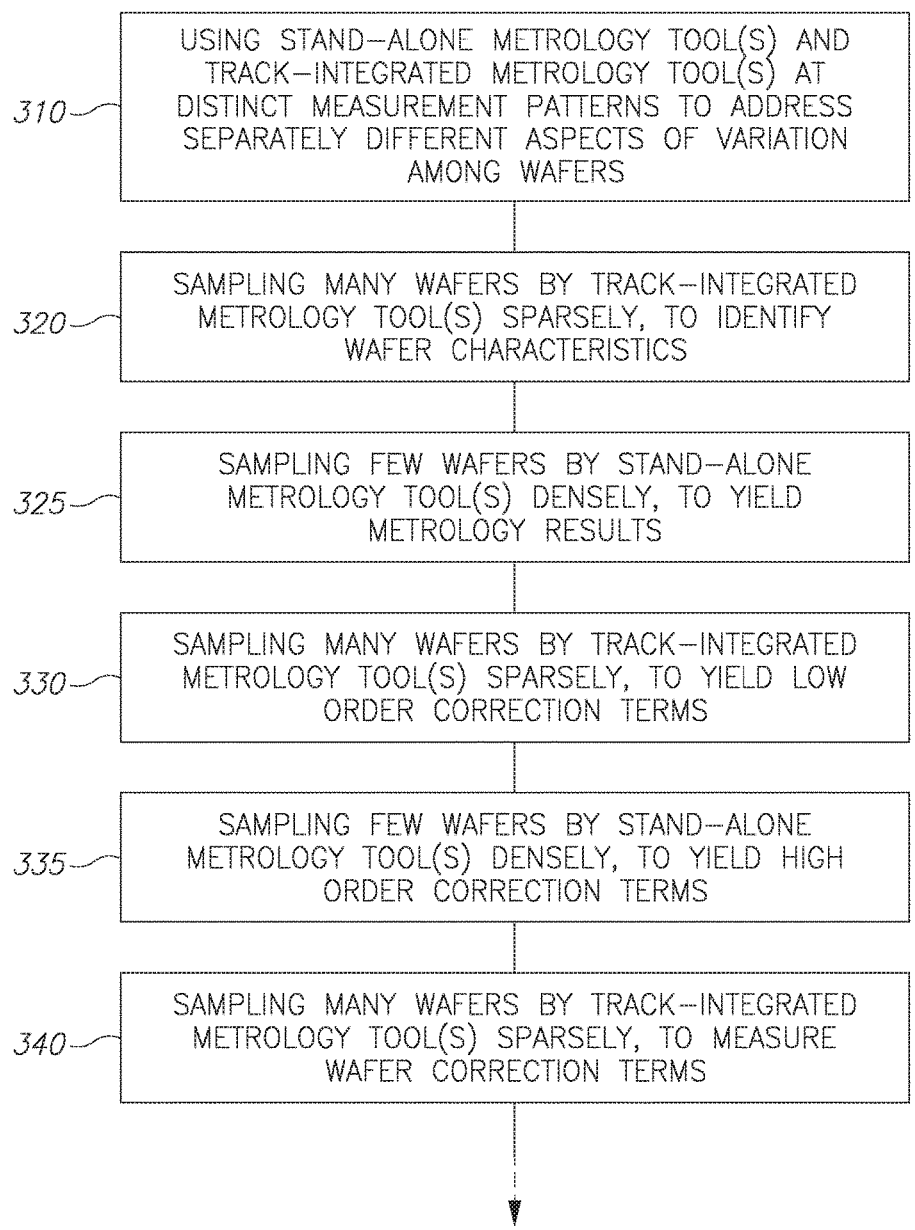
FIG. 6 is a high level flowchart illustrating a method, according to some embodiments of the invention.

FIG. 6 is a high level flowchart illustrating a method 300, according to some embodiments of the invention. Method 300 may be at least partially implemented by at least one computer processor, e.g., in a metrology system. Certain embodiments comprise computer program products comprising a computer readable storage medium having computer readable program embodied therewith and configured to carry out of the relevant stages of method 300.

Method 300 may comprise using at least one stand-alone metrology tool and at least one track-integrated metrology tool at distinct measurement patterns to address separately different aspects of variation among wafers (stage 310).

In certain embodiments, the distinct measurement patterns may comprise sparse sampling of wafers by the at least one track-integrated metrology tool to identify characteristics of the sparsely-sampled wafers, wherein the sparsely-sampled wafers comprise at least a half (e.g., 12 wafers or more) of the wafers in a lot (stage 320), and dense sampling of wafers by the at least one stand-alone metrology tool to yield metrology results within the densely-sampled wafers, wherein the densely-sampled wafers comprise at most a tenth (e.g., 1-3 wafers) of the wafers in the lot (stage 325). For example, the sparsely-sampled wafers may comprise between 15 and 25 wafers per lot, which are sampled at between 30 and 50 locations per wafer, and the densely-sampled wafers may comprise between 1 and 3 wafers per lot, which are sampled at between 400 and 800 locations per wafer.

In certain embodiments, the distinct measurement patterns may comprise sparse sampling of wafers by the at least one track-integrated metrology tool to yield low order correction terms, wherein the sparsely sampled wafers comprise at least a fifth (e.g., 5 wafers or more) of the wafers in a lot (stage 330), and dense sampling of wafers by the at least one stand-alone metrology tool to yield low order correction terms, wherein the densely sampled wafers comprise at most a tenth (e.g., 2-3 wafers) of the wafers in the lot (stage 335). For example, the sparsely-sampled wafers may comprise between 5 and 10 wafers per lot, which are sampled at between 100 and 200 locations per wafer, and the densely-sampled wafers may comprise between 1 and 3 wafers per lot, which are sampled at between 400 and 800 locations per wafer.

In certain embodiments, the distinct measurement patterns may comprise sparse sampling of wafers by the at least one track-integrated metrology tool to measure wafer correction terms (stage 340), wherein the sparsely sampled wafers may comprise at least a fifth (e.g., 5 wafers in a lot) of the wafers in a lot, and dense sampling of wafers by the at least one stand-alone metrology tool to measure field correction terms (stage 345), wherein the densely sampled wafers may comprise at most a tenth (e.g., 2-3 wafers) of the wafers in the lot.

In certain embodiments, method 300 may further comprise selecting the (fewer) densely-sampled wafers according to measurements of the (more) sparsely-sampled wafers (stage 350).

Advantageously, the disclosed measurements prior to the completion of metrology target production may improve the scanner alignment and may enable scanner adaptation to wafer-to-wafer variation. Additionally, the disclosed procedures may reduce the rework rate and the yield loss related to overlay errors.

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
producing a first layer of a metrology target via a lithography tool;
measuring at least a first metrology parameter for the first layer and at least one alignment mark via a first overlay metrology tool of a lithography process track, the lithography process track including the lithography tool;
deriving at least one merit figure from the at least a first metrology parameter and the at least one alignment mark;
deriving at least one correction factor from the at least one merit figure;
providing at least one of the at least one merit figure or the at least one correction factor to the lithography tool via at least one of a feed forward loop or a feedback loop;
producing a second layer of the metrology target based on at least one of the at least one merit figure or the at least one correction factor via the lithography tool;
measuring at least a second metrology parameter for the first layer and the second layer via a second overlay metrology tool separate from the lithography process track;
deriving at least one overlay adjustment from the at least a second metrology parameter; and
providing the at least one overlay adjustment to the lithography tool via at least one of a feed forward loop or a feedback loop.

2. The method of claim 1, further comprising:
correlating the at least one merit figure with at least one random error or systematic error of at least one assembly or control loop of the lithography tool.

3. The method of claim 1, further comprising:
correlating the at least one merit figure with an optical bias associated with a process-induced alignment target asymmetry.

4. The method of claim 3, further comprising:
selecting at least an additional alignment mark based on the at least one merit figure,
wherein the at least one additional alignment mark is selected to align the lithography tool.

5. The method of claim 1, further comprising:
selecting at least an additional metrology target based on the at least one merit figure,
wherein the at least one an additional metrology target is selected for one or more additional metrology measurements.

6. The method of claim 1, further comprising:
at least one of choosing or adapting a metrology recipe based on the at least one merit figure.

7. The method of claim 6, further comprising:
providing the metrology recipe to the lithography tool via at least one of a feed forward or a feedback loop.

8. The method of claim 7, further comprising:
producing the second layer of the metrology target based on at least one of the at least one merit figure, the at least one correction factor, or the metrology recipe via the lithography tool.

9. A non-transitory computer readable storage medium having a set of computer readable program instructions executable by at least one processor, the set of computer readable program instructions including instructions for the at least one processor to:
receive a first measurement including at least a first metrology parameter of a first layer of a metrology target and at least one alignment mark, wherein the first measurement is received from a first overlay metrology tool of a lithography process track, the lithography process track including a lithography tool;
derive at least one merit figure from the at least a first metrology parameter and the at least a first alignment mark;
derive at least one correction factor from the at least one merit figure;
provide at least one of the at least one merit figure and the at least one correction factor to the lithography tool via at least one of a feed forward loop or a feedback loop;
receive a second measurement including at least a second metrology parameter of the first layer and a second layer, wherein the at least a second measurement is received from a second overlay metrology tool separate from the lithography process track;
derive at least one overlay adjustment from the at least a second metrology parameter; and
provide the at least one overlay adjustment to the lithography tool via at least one of a feed forward loop or a feedback loop,
wherein the first layer and the second layer of the metrology target are produced by the lithography tool,
wherein the second layer is produced by the lithography tool based on at least one of the at least one merit figure and the at least one correction factor.

10. A system comprising:
a lithography process track, comprising: a lithography tool configured to produce at least a first layer and a second layer of a metrology target; and a first overlay metrology tool configured to measure at least a first metrology parameter for the first layer and at least one alignment mark;
a second overlay metrology tool separate from the lithography process track, the second overlay metrology tool configured to measure at least a second metrology parameter for the first layer and the second layer; and
at least one control unit configured to:
derive at least one merit figure from the at least a first metrology parameter and the at least one alignment mark;
derive at least one correction factor from the at least one merit figure;
provide at least one of the at least one merit figure or the at least one correction factor to the lithography tool via at least one of a feed forward loop or a feedback loop;
derive at least one overlay adjustment from the at least a second metrology parameter; and
provide the at least one overlay adjustment to the lithography tool via at least one of a feed forward loop or a feedback loop,
wherein the lithography tool is adjustable based on at least one of the at least one merit figure or the at least one correction factor prior to producing the second layer of the metrology target.

11. A method comprising:
sampling one or more locations on one or more wafers of a first portion of wafers in a wafer lot with a first measurement pattern to obtain a first set of measurements via a first overlay metrology tool of a lithography process track, the lithography process track including a lithography tool, the first portion of the wafer lot including a smaller number of wafers than the number of wafers in the wafer lot; and
sampling one or more locations on one or more wafers of a second portion of wafers in the wafer lot with a second measurement pattern to obtain a second set of measurements via a second overlay metrology tool separate from the lithography process track, the second portion of the wafer lot including a smaller number of wafers than the number of wafers in the first portion of the wafer lot.

12. The method of claim 11,
wherein the first portion of the wafer lot includes at least a half of the wafer lot,
wherein the first set of measurements include one or more wafer characteristics for one or more wafers in the first portion of the wafer lot,
wherein the second portion of the wafer lot includes at most a tenth of the wafer lot,
wherein the second set of measurements include one or more metrology results for one or more wafers in the second portion of the wafer lot.

13. The method of claim 12,
wherein the first portion of the wafer lot includes between 15 and 25 wafers, wherein at least some of the between 15 and 25 wafers are sampled at between 30 and 50 locations per wafer,
wherein the second portion of the wafer lot includes between 1 and 3 wafers, wherein at least some of the between 1 and 3 wafers are sampled at between 400 and 800 locations per wafer.

14. The method of claim 12, further comprising:
selecting the second portion of the wafer lot based on the measured one or more characteristics of the first portion of the wafer lot.

15. The method of claim 11,
wherein the first portion of the wafer lot includes at least a fifth of the wafer lot,
wherein the first set of measurements include one or more low order lithography tool correction terms for one or more wafers in the first portion of the wafer lot,
wherein the second portion of the wafer lot includes at most a tenth of the wafer lot,
wherein the second set of measurements include one or more high order lithography tool correction terms for one or more wafers in the second portion of the wafer lot.

16. The method of claim 15,
wherein the first portion of the wafer lot includes between 5 and 10 wafers, wherein at least some of the between 5 and 10 wafers are sampled at between 100 and 200 locations per wafer,
wherein the second portion of the wafer lot includes between 1 and 3 wafers, wherein at least some of the between 1 and 3 wafers are sampled at between 400 and 800 locations per wafer.

17. The method of claim 11,
wherein the first portion of the wafer lot includes at least a fifth of the wafer lot,
wherein the first set of measurements includes one or more wafer correction terms for one or more wafers in the first portion of the wafer lot,
wherein the second portion of the wafer lot includes at most a tenth of the wafer lot,
wherein the second set of measurements includes one or more field correction terms for one or more wafers in the second portion of the wafer lot.

18. The method of claim 17,
wherein the first portion of the wafer lot includes between 5 and 10 wafers, wherein at least some of the between 5 and 10 wafers are sampled at between 100 and 200 locations per wafer,
wherein the second portion of the wafer lot includes 2 wafers, wherein at least one of the 2 wafers is sampled at 600 locations per wafer.

19. A system comprising:
a lithography process track, comprising: a lithography tool; and a first overlay metrology tool configured to sample one or more locations on one or more wafers of a first portion of wafers in a wafer lot, the first portion of the wafer lot including a smaller number of wafers than the number of wafers in the wafer lot, with a first measurement pattern to obtain a first set of measurements; and
a second overlay metrology tool separate from the lithography process track, the second overlay metrology tool configured to sample one or more locations on one or more wafers of a second portion of wafers in the wafer lot, the second portion of the wafer lot including a smaller number of wafers than the number of wafers in the first portion of the wafer lot, with a second measurement pattern to obtain a second set of measurements.

* * * * *